(12) United States Patent
Murata et al.

(10) Patent No.: US 10,477,732 B2
(45) Date of Patent: Nov. 12, 2019

(54) LIGHT IRRADIATION DEVICE, LIGHT IRRADIATION SYSTEM, AND IMAGE FORMING APPARATUS

(71) Applicant: FUJI XEROX CO., LTD., Tokyo (JP)

(72) Inventors: Michiaki Murata, Kanagawa (JP); Akira Sakamoto, Kanagawa (JP); Atsuyuki Kitamura, Kanagawa (JP); Hiroyuki Tsukuni, Kanagawa (JP); Akira Mihara, Kanagawa (JP); Naoya Kamigaito, Kanagawa (JP); Satoshi Tejima, Kanagawa (JP); Junichiro Hayakawa, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/943,715

(22) Filed: Apr. 3, 2018

(65) Prior Publication Data
US 2018/0310438 A1  Oct. 25, 2018

(30) Foreign Application Priority Data

Apr. 19, 2017 (JP) ................................ 2017-083233

(51) Int. Cl.
| | |
|---|---|
| *H05K 7/20* | (2006.01) |
| *H01S 5/024* | (2006.01) |
| *B41J 2/01* | (2006.01) |
| *F21V 29/57* | (2015.01) |
| *B41J 11/00* | (2006.01) |
| *B05D 3/06* | (2006.01) |

(52) U.S. Cl.
CPC ............ *H05K 7/20927* (2013.01); *B41J 2/01* (2013.01); *B41J 11/002* (2013.01); *F21V 29/57* (2015.01); *H01S 5/02423* (2013.01); *B05D 3/06* (2013.01)

(58) Field of Classification Search
CPC .......... F21V 29/30; F21V 29/56; F21V 29/57; F21V 29/58; F21V 29/59; H05K 7/20927
See application file for complete search history.

(56) References Cited

U.S. PATENT DOCUMENTS

| | | | |
|---|---|---|---|
| 6,084,771 A | 7/2000 | Ranchy et al. | |
| 2011/0204261 A1* | 8/2011 | Dahm | F21V 29/30 250/492.1 |
| 2016/0209020 A1* | 7/2016 | Sprankle | F21V 29/56 |
| 2018/0216802 A1* | 8/2018 | Johnson, III | F21V 29/51 |

FOREIGN PATENT DOCUMENTS

| | | |
|---|---|---|
| JP | H1167999 | 3/1999 |
| JP | H11254746 | 9/1999 |
| JP | 2004148698 | 5/2004 |
| JP | 2005158902 | 6/2005 |

* cited by examiner

*Primary Examiner* — Alexander K Garlen
(74) *Attorney, Agent, or Firm* — JCIPRNET

(57) ABSTRACT

A light irradiation device includes a light emitting unit, a cooling unit, a supply unit, and a driving unit. The light emitting unit emits light while generating heat. The cooling unit includes a channel through which a coolant flows, a first surface on which the light emitting unit is mounted, and a second surface that faces a direction opposite to the first surface. The supply unit is disposed facing the second surface in one direction that the second surface faces and supplies the coolant to the cooling unit. The driving unit is disposed facing the second surface in the one direction and includes a driving board that drives the light emitting unit.

6 Claims, 10 Drawing Sheets

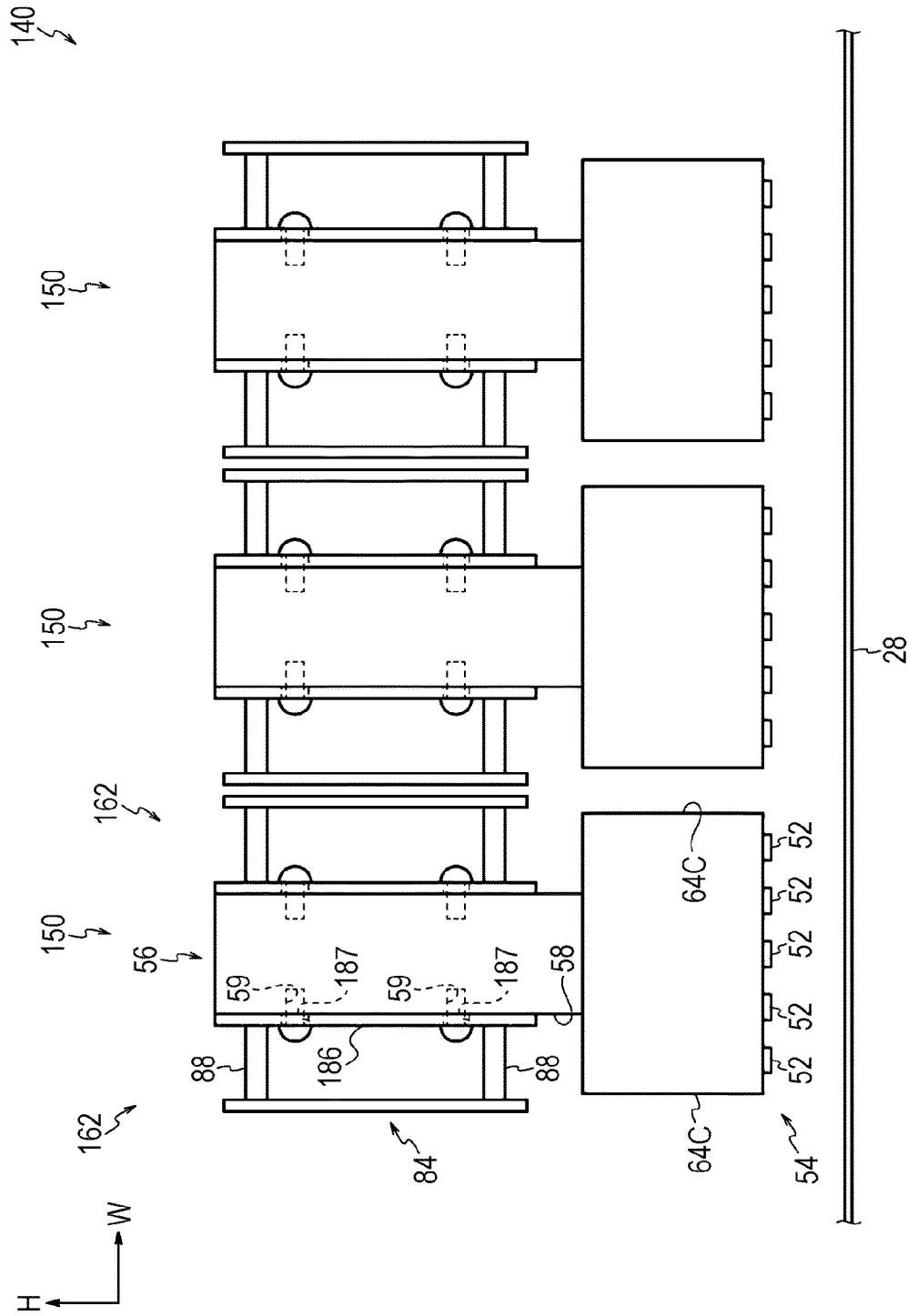

LIGHT IRRADIATION DEVICE, LIGHT IRRADIATION SYSTEM, AND IMAGE FORMING APPARATUS

CROSS-REFERENCE TO RELATED APPLICATIONS

This application is based on and claims priority under 35 USC 119 from Japanese Patent Application No. 2017-083233 filed Apr. 19, 2017.

BACKGROUND

Technical Field

The present invention relates to a light irradiation device, a light irradiation system, and an image forming apparatus.

SUMMARY

According to an aspect of the invention, there is provided a light irradiation device including a light emitting unit, a cooling unit, a supply unit, and a driving unit. The light emitting unit emits light while generating heat. The cooling unit includes a channel through which a coolant flows, a first surface on which the light emitting unit is mounted, and a second surface that faces a direction opposite to the first surface. The supply unit is disposed facing the second surface in one direction that the second surface faces and supplies the coolant to the cooling unit. The driving unit is disposed facing the second surface in the one direction and includes a driving board that drives the light emitting unit.

BRIEF DESCRIPTION OF THE DRAWINGS

Exemplary embodiments of the present invention will be described in detail based on the following figures, wherein:

FIG. 10 is a front view of a light irradiation system according to a second exemplary embodiment of the present invention.

DETAILED DESCRIPTION

First Exemplary Embodiment

Figure 1:
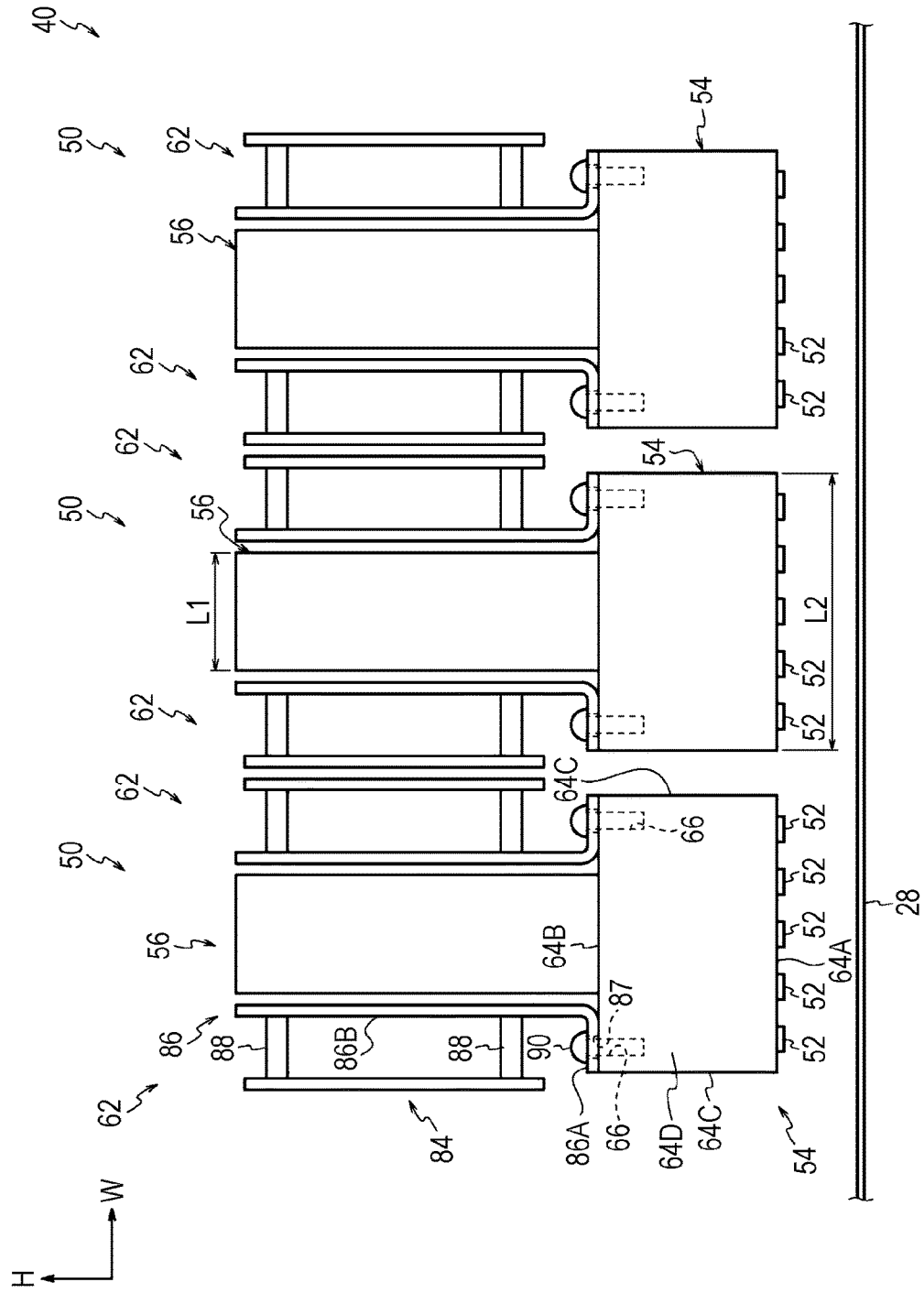
FIG. 1 is a front view of a light irradiation system according to a first exemplary embodiment of the present invention.

An example of a light irradiation device, a light irradiation system, and an image forming apparatus according to a first exemplary embodiment of the present invention will be described with reference to FIGS. 1 to 9. Arrow H depicted in the drawings represents a vertical direction, which is the top-to-bottom direction of the image forming apparatus, arrow W represents a horizontal direction, which is the width direction of the image forming apparatus, and arrow D represents a horizontal direction, which is the depth direction of the image forming apparatus.

Overall Configuration

Figure 8:
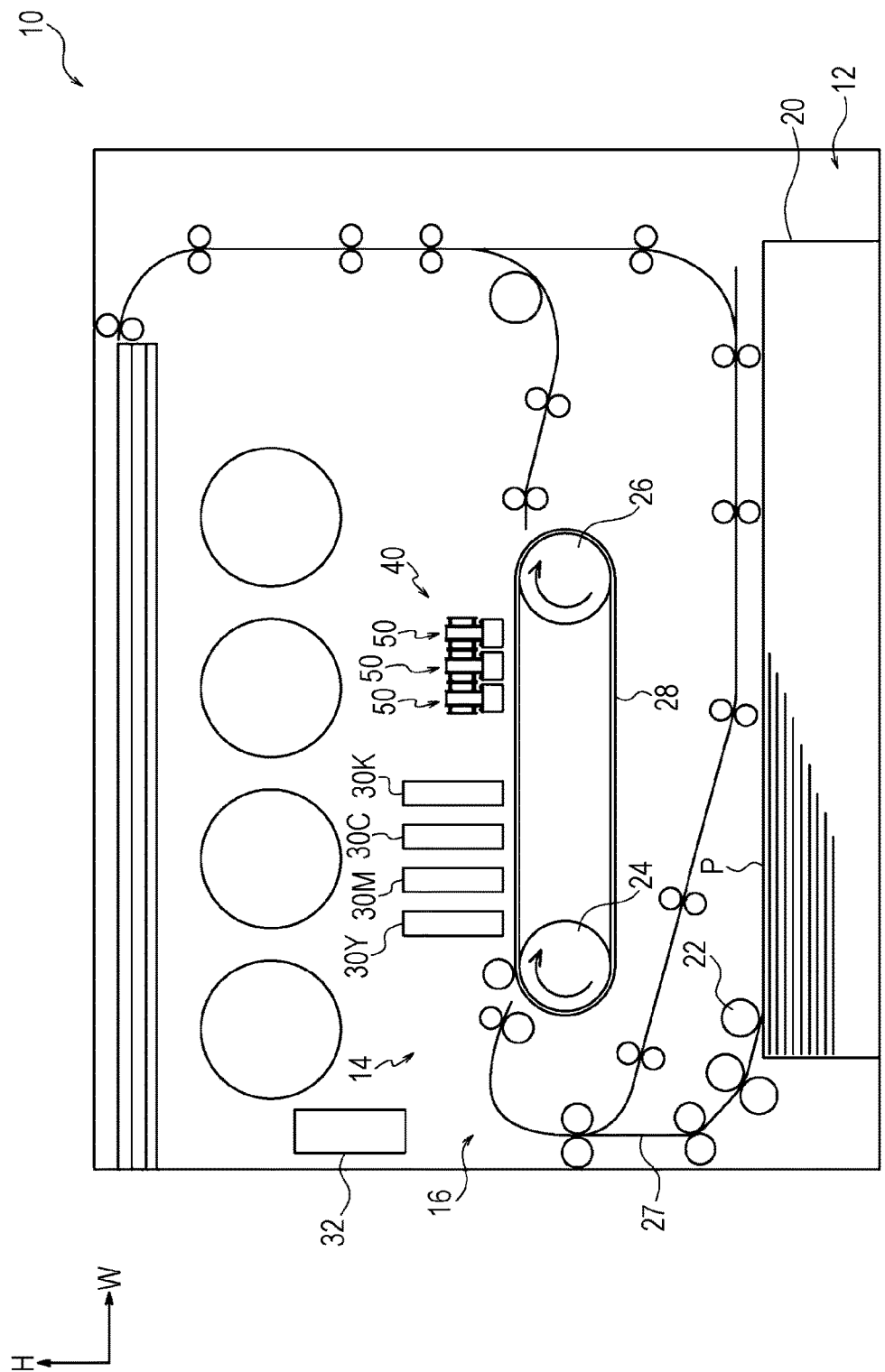
FIG. 8 is a schematic configuration diagram of an image forming apparatus according to the first exemplary embodiment of the present invention.

As depicted in FIG. 8, an image forming apparatus 10 is an inkjet recording apparatus and includes a sheet container 12, which contains sheet members P used as a recording medium, an image forming unit 14, which forms images on the sheet members P, and a transport unit 16, which transports the sheet members P. Further, the image forming apparatus 10 includes a light irradiation system 40, which irradiates images formed on the sheet members P with light and dries the sheet members P, and a controller 32, which controls the individual units.

Sheet Container

The sheet container 12 includes a sheet-containing member 20, which contains the multiple sheet members P, and a pick-up roll 22, which conveys the top sheet of the sheet members P contained in the sheet-containing member 20 to a transport path 27 of the sheet members P.

Transport Unit

The transport unit 16 includes multiple transport rolls (reference numerals omitted) that transport along the transport path 27 the sheet members P conveyed from the sheet container 12.

Image Forming Unit

The image forming unit 14 includes a drive roll 24, which is rotationally driven, an idle roll 26, which is disposed on the right side of the drive roll 24 in FIG. 8 and rotatably supported, and a transport belt 28, which is looped around the drive roll 24 and the idle roll 26. The transport belt 28 electrostatically attracts, holds, and transports the sheet members P.

In addition, the image forming unit 14 includes four droplet discharge heads 30Y, 30M, 30C, and 30K, which respectively correspond to four colors, yellow (Y), magenta (M), cyan (C), and black (K), and discharge ink droplets (an example of liquid droplets) to the sheet members P to be transported. The droplet discharge heads 30Y, 30M, 30C, and 30K are disposed between the drive roll 24 and the idle roll and above the transport belt 28 and arranged in this order from the upstream side in the transport direction of the sheet members P. Hereinafter, the droplet discharge heads 30Y, 30M, 30C, and 30K are referred to as droplet discharge heads 30 without appending the alphabetical character when the color is not specified or the droplet discharge heads are referred to collectively.

Light Irradiation System

The light irradiation system 40 is disposed on the downstream side of the droplet discharge heads 30 in the transport direction of the sheet members P (hereinafter referred to as a sheet transport direction) and above the transport belt 28. The light irradiation system 40 irradiates with light the sheet members P on which images have been formed and dries the sheet members P. The light irradiation system 40 will be described in detail below.

Operation of Overall Configuration

Next, operation of the image forming apparatus 10 will be described.

The top sheet of the sheet members P contained in the sheet-containing member 20 is conveyed to the transport path 27 by the pick-up roll 22. The sheet member P conveyed to the transport path 27 is transported along the transport path 27 by using multiple transport rolls. The sheet member P is electrostatically attracted (held) by the transport belt 28.

The sheet member P electrostatically attracted by the transport belt 28 is transported by the circling transport belt 28. Subsequently, by using ink droplets (liquid droplets) discharged from the droplet discharge heads 30 of four colors, an image is formed on the sheet member P.

The sheet member P on which the image has been formed is irradiated with light by the light irradiation system 40 when the sheet member P passes under the light irradiation system 40. Subsequently, the image formed on the sheet member P is dried.

The sheet member P transported by the transport belt 28 is released from the transport belt 28 by a release plate (not depicted). The released sheet member P is transported along the transport path 27 by using multiple transport rolls and is discharged to outside the apparatus.

Configuration of Light Irradiation System

Next, the light irradiation system 40 will be described.

As described above, the light irradiation system 40 is disposed on the downstream side of the droplet discharge heads 30 in the sheet transport direction and above the transport belt 28.

As depicted in FIG. 1, the light irradiation system 40 includes three light irradiation devices 50 aligned in the width direction of the apparatus (sheet transport direction).

Light Irradiation Device

Figure 2:
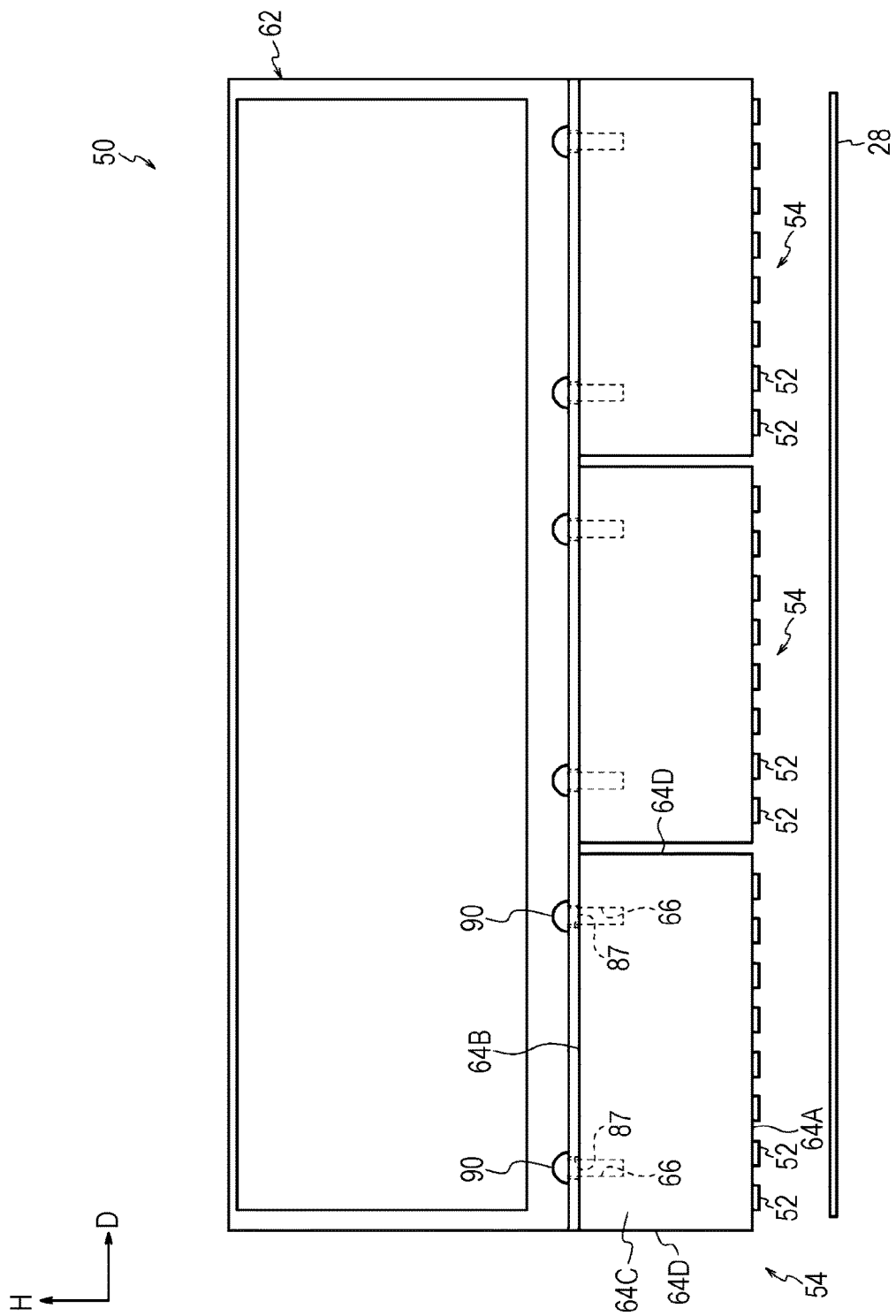
FIG. 2 is a side view of the light irradiation system according to the first exemplary embodiment of the present invention.

As depicted in FIGS. 1 and 2, each of the light irradiation devices 50 includes multiple light emitting units 52, three cooling units 54 on which the light emitting units 52 are mounted, a supply unit 56 that supplies cooling liquid to each of the cooling units 54, and a driving unit that includes driving boards 84 that drive the light emitting units 52.

Cooling Unit

Figure 3:
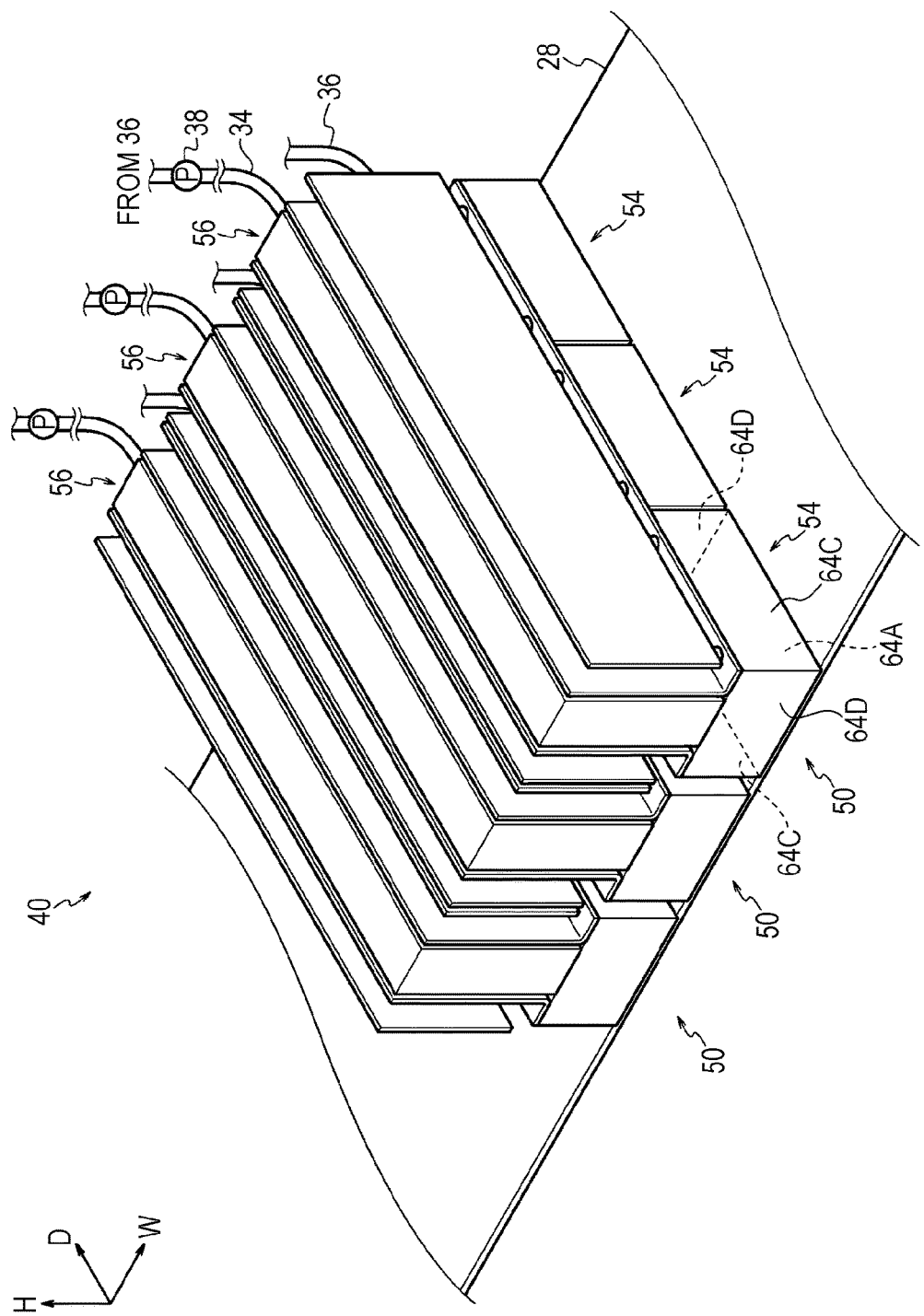
FIG. 3 is a perspective view of the light irradiation system according to the first exemplary embodiment of the present invention.

Each of the cooling units 54 is made of metal materials and has a rectangular parallelepiped shape extending in the depth direction of the apparatus as depicted in FIGS. 2 and 3. The three cooling units 54 are aligned in the depth direction of the apparatus. Each of the cooling units 54 may have a parallelepiped shape as a whole, and a corner portion or the like that is round, and notches and protrusions in some portions, are included in the parallelepiped shape as a whole.

Each of the cooling units 54 is constituted by a first surface 64A facing the transport belt 28, a second surface 64B facing a direction opposite to the first surface 64A, a pair of side surfaces 64C facing the width direction of the apparatus, and a pair of depth surfaces 64D facing the depth direction of the apparatus. The multiple light emitting units 52 are mounted on the first surface 64A.

As depicted in FIG. 1, multiple mounting holes 66 are formed at the edge portions in the width direction of the apparatus on the second surface 64B so that brackets 86 described below are fixed to the cooling units 54. Female threads are formed inside the mounting holes 66.

Further, as depicted in FIGS. 5, 6A, 6B, and 7, a cooling channel 70 through which the cooling liquid flows is formed inside the cooling unit 54. The cooling channel 70 is an example of a passage.

The cooling channel 70 includes multiple branch channels 70A, an inflow channel 70B, and an outflow channel 70C. The multiple branch channels 70A, through which the cooling liquid flows, extend in the depth direction of the apparatus along the first surface 64A and are arranged side-by-side in the width direction of the apparatus. The cooling liquid supplied from the supply unit 56 flows through the inflow channel 70B, and the cooling liquid to be discharged to the supply unit 56 flows through the outflow channel 70C. In addition, the cooling channel 70 includes multiple connecting channels 70D that connect the inflow channel 70B to the branch channels 70A and multiple connecting channels 70E that connect the outflow channel 70C to the branch channels 70A.

The inflow channel 70B and the outflow channel 70C extend in the top-to-bottom direction and are arranged side-by-side in the depth direction of the apparatus. Specifically, the inflow channel 70B and the outflow channel 70C are arranged in this order from front to back in the depth direction of the apparatus, and the upper ends of the inflow channel 70B and the outflow channel 70C open into the second surface 64B.

Each of the multiple connecting channels 70D is connected to an end of a corresponding one of the branch channels 70A at one end, extends upward with bends, and is connected to the lower end of the inflow channel 70B at the other end. Each of the multiple connecting channels 70E is connected to the other end of a corresponding one of the branch channels 70A at one end, extends upward with bends, and is connected to the lower end of the outflow channel 70C at the other end.

Figure 5:
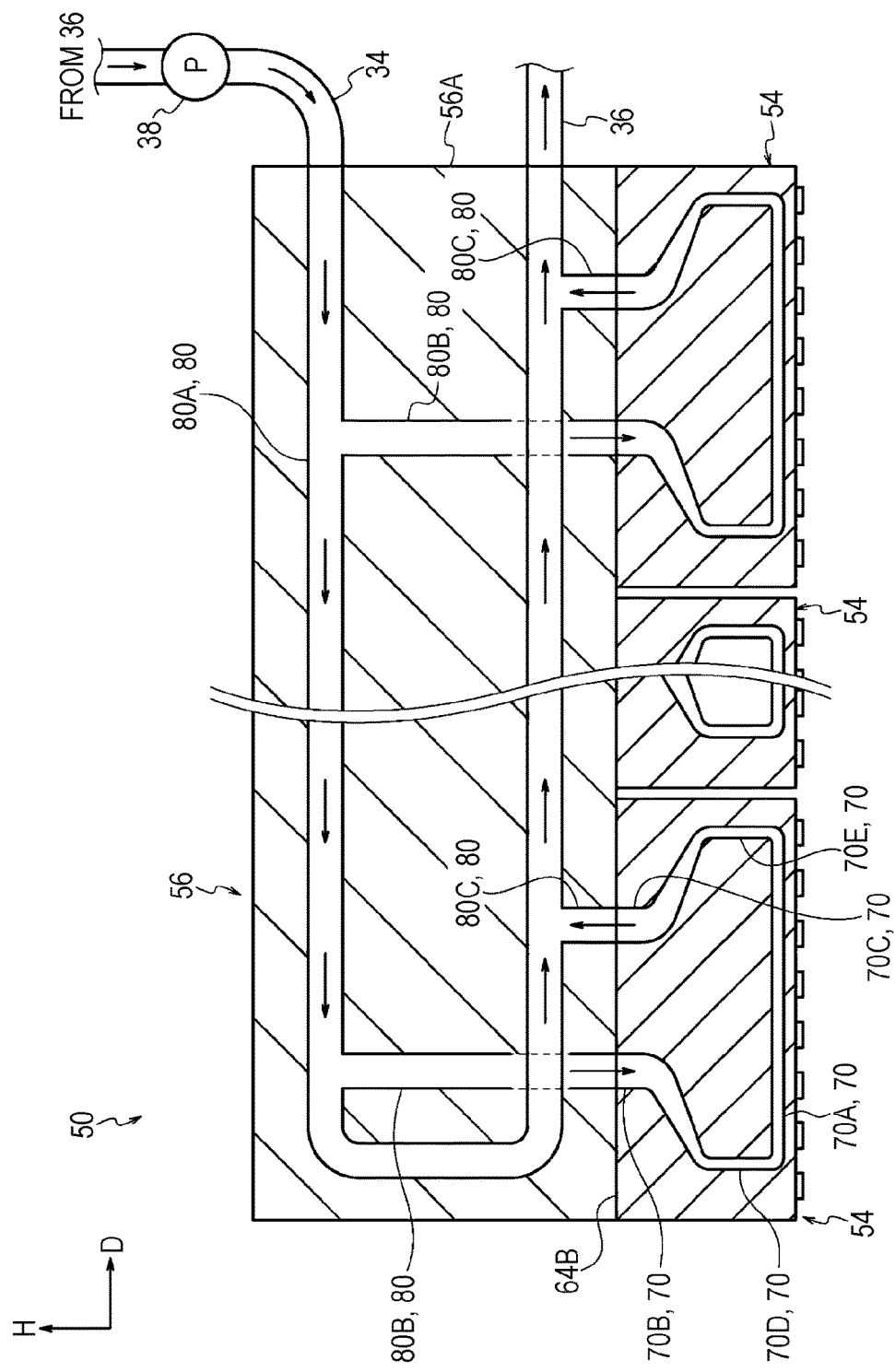
FIG. 5 is a cross-sectional view of a light irradiation device according to the first exemplary embodiment of the present invention.
Figure 6A:
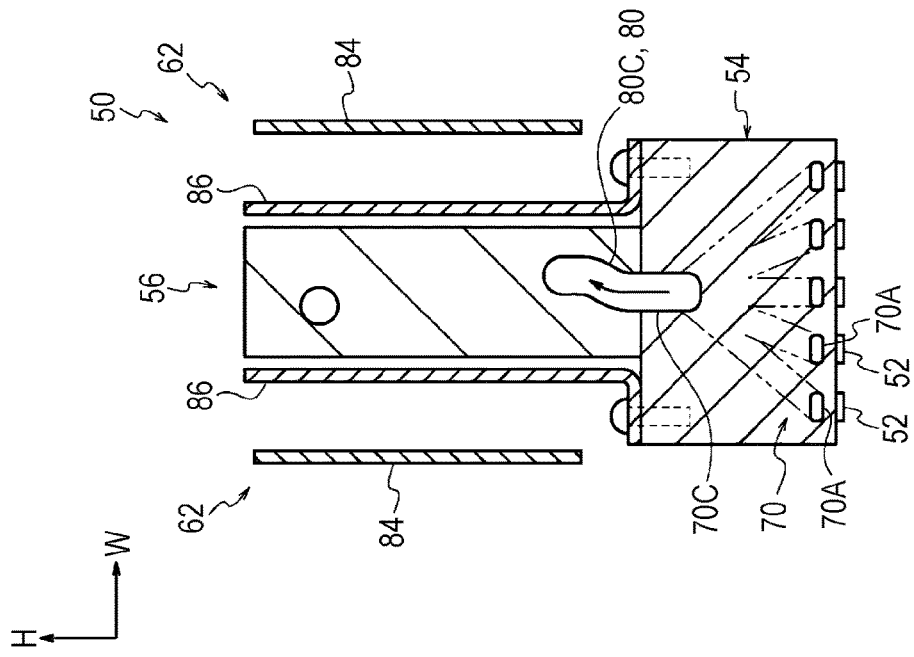
FIGS. 6A and 6B are cross-sectional views of the light irradiation device according to the first exemplary embodiment of the present invention.
Figure 6B:
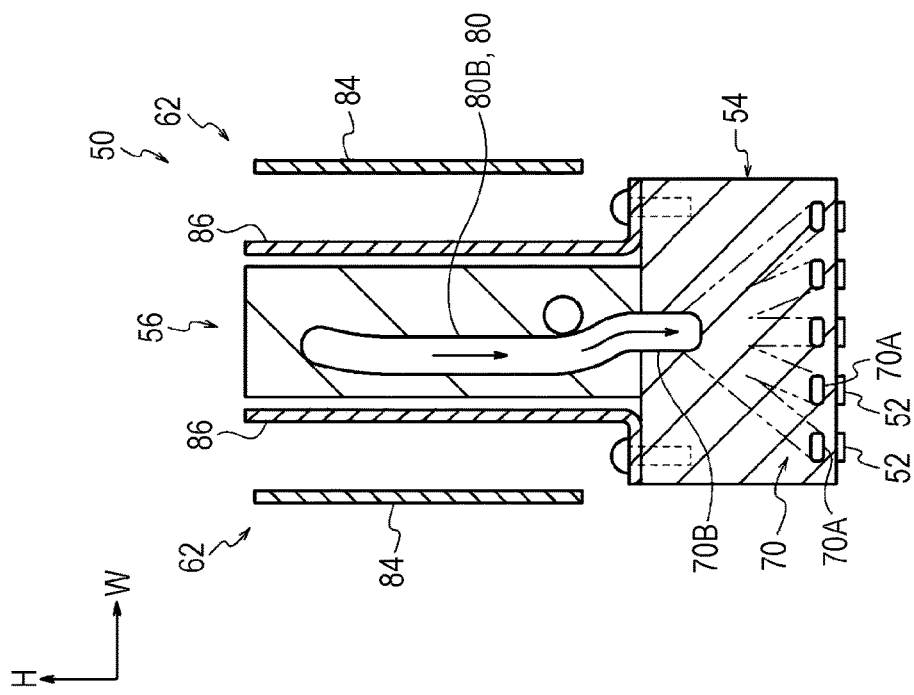
Figure 7:
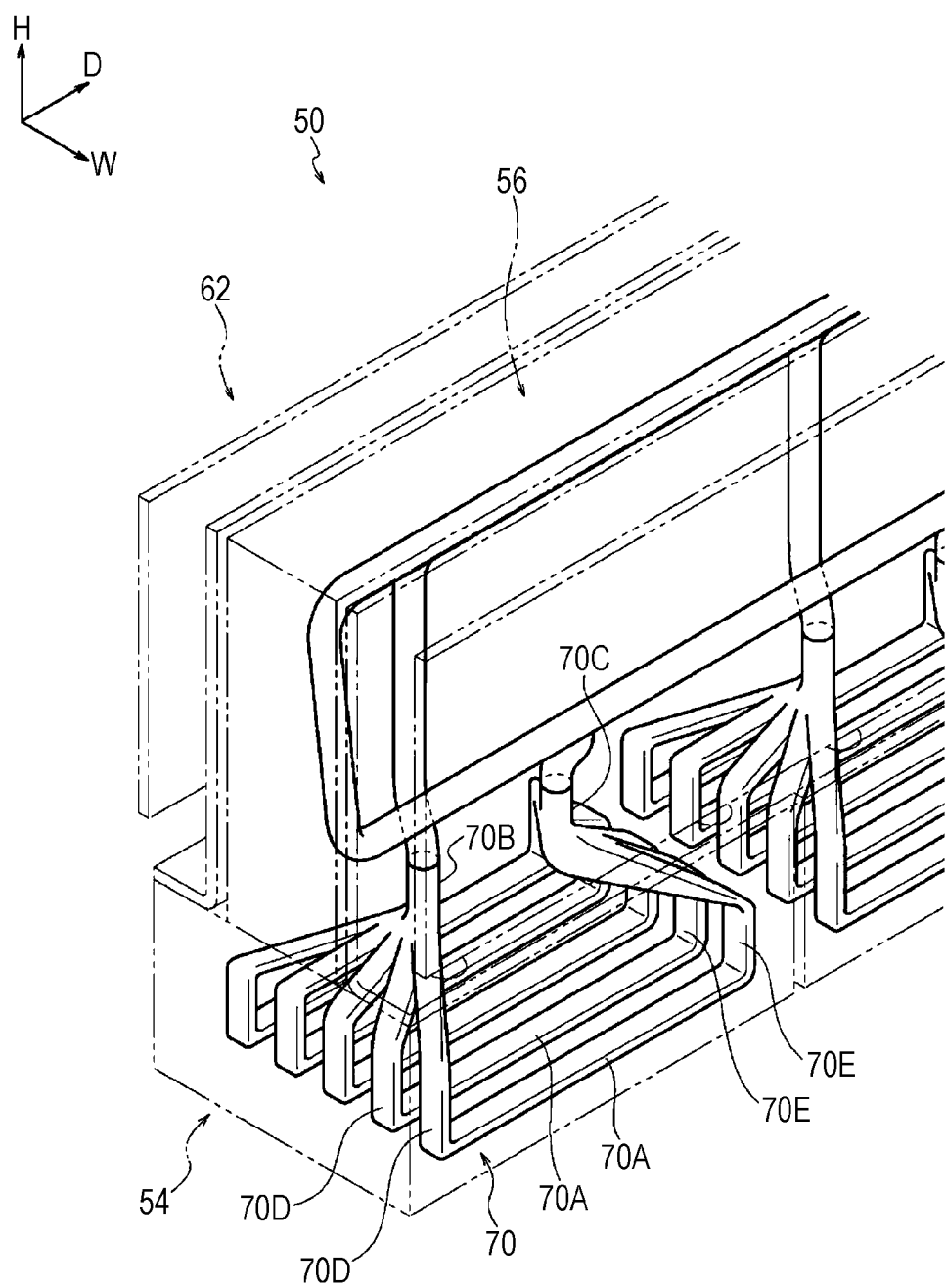
FIG. 7 is a perspective view of the light irradiation device according to the first exemplary embodiment of the present invention.

In this configuration, the cooling liquid flowing into the cooling unit 54 from the inflow channel 70B flows through the multiple connecting channels 70D, the multiple branch channels 70A, and the multiple connecting channels 70E in this order and is discharged through the outflow channel 70C (see arrows in FIG. 5).

Light Emitting Unit

Figure 4:
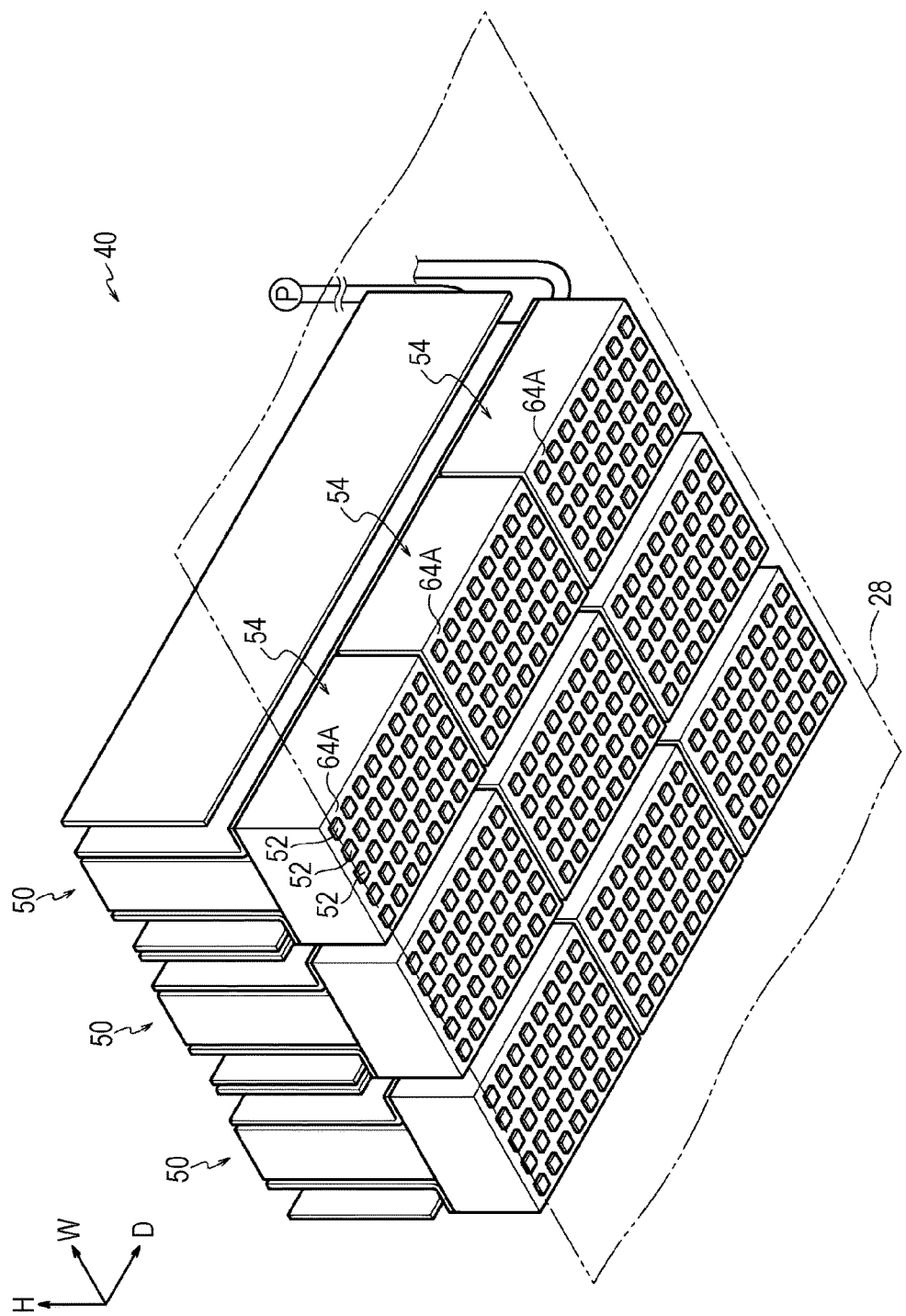
FIG. 4 is a perspective view of the light irradiation system according to the first exemplary embodiment of the present invention.

The light emitting units 52 are so-called surface emitting lasers (VCSEL), and each of the light emitting units 52 has a rectangular parallelepiped shape. The multiple light emitting units 52 are mounted on the first surface 64A of the cooling unit 54 as depicted in FIG. 4. Specifically, the multiple light emitting units 52 are arranged in the width direction and the depth direction of the apparatus. The light emitting units 52 placed adjacent to each other in the width direction of the apparatus are electrically connected to each other via harness wires (not depicted).

In this configuration, the light emitting units 52 to which a voltage is applied via the driving boards 84 described below emit light while generating heat.

Supply Unit

The supply unit 56 is made of metal materials and has a rectangular parallelepiped shape extending in the depth direction of the apparatus as depicted in FIG. 3. The supply unit 56 is disposed so as to face the second surfaces 64B of the three cooling units 54 in the top-to-bottom direction of the apparatus (one direction). In short, the supply unit 56 is disposed so as to extend over the three cooling units 54. The supply unit 56 is fixed by using fixing members (not depicted) to the second surfaces 64B of the three cooling units 54 arranged in the depth direction of the apparatus.

As depicted in FIG. 1, the supply unit 56 has a rectangular shape elongated in the top-to-bottom direction of the apparatus when viewed in the depth direction of the apparatus. The length of the supply unit 56 in the width direction of the apparatus (L1 in FIG. 1) is shorter than the length of the cooling unit 54 in the width direction of the apparatus (L2 in FIG. 1). The supply unit 56 is disposed in the center portion of the cooling unit 54 in the width direction of the apparatus. In this exemplary embodiment, the center line of the supply unit 56 in the width direction is coincident with the center line of the cooling unit 54 in the width direction.

Further, as depicted in FIG. 5, a supply channel 80 to supply the cooling liquid to the cooling units 54 is formed inside the supply unit 56. The supply channel 80 includes a U-shaped main channel 80A extending in the depth direction of the apparatus, connecting channels 80B, and connecting channels 80C. Each of the connecting channels 80B connects the inflow channel 70B of a corresponding one of the cooling units 54 to the main channel 80A, and each of the connecting channels 80C connects the outflow channel 70C of a corresponding one of the cooling units 54 to the main channel 80A.

Both ends of the main channel 80A open into an inward side surface 56A, which faces inward in the depth direction of the apparatus, of the supply unit 56. A supply pipe 34 to supply the cooling liquid to the supply channel 80 is connected to one end of the main channel 80A, and a discharge pipe 36 to discharge the cooling liquid from the supply channel 80 is connected to the other end of the main channel 80A. A pump 38 is disposed between the discharge pipe 36 and the supply pipe 34. In addition, a storage tank (not depicted) that stores the cooling liquid is disposed in the middle of the discharge pipe 36. In other words, the passage through which the cooling liquid flows forms a closed loop in this exemplary embodiment.

In this configuration, by operating the pump 38, the cooling liquid flows through the main channel 80A of the supply unit 56. The cooling liquid flowing through the main channel 80A flows through the connecting channel 80B and flows into the inflow channel 70B of the cooling unit 54. Subsequently, after flowing through the cooling channel 70 of the cooling unit 54, the cooling liquid flows through the connecting channel 80C of the supply unit 56 and flows into the main channel 80A of the supply unit 56 (see arrows in FIG. 5).

Driving Unit

The driving unit 62 has two parts, one of which is disposed on one side of the supply unit 56 in the width direction of the apparatus, and the other of which is disposed on the other side of the supply unit 56, as depicted in FIGS. 1 and 3. The two parts of the driving unit 62 form a symmetrical shape with the supply unit 56 interposed therebetween when viewed in the depth direction of the apparatus. At least a portion of each part of the driving unit 62 is disposed so as to face the second surfaces 64B of the cooling units 54 in the top-to-bottom direction (the one direction). Hereinafter, one of the parts of the driving unit 62 will be described.

Each of the parts of the driving unit 62 includes the driving board 84 to drive the light emitting units 52, the bracket 86 with which the driving board 84 is fixed to the second surfaces 64B of the cooling units 54, and multiple spacers 88.

The bracket 86 extends in the depth direction of the apparatus and has an L-shaped cross section. The bracket 86 has a bottom plate 86A whose plate surface is in contact with the second surfaces 64B of the cooling units 54 and a side plate 86B whose plate surface faces the width direction of the apparatus. The side plate 86B is connected to an edge of the bottom plate 86A, the edge being closer to the supply unit 56.

The bottom plate 86A has multiple through holes 87. Screws 90 are screwed from above into the mounting holes 66 of the cooling units 54 through the through holes 87, and the driving unit 62 (bracket 86) is fixed to the cooling units 54. The screws 90 are an example of a fixing member.

The side plate 86B and the supply unit 56 are disposed with a gap interposed therebetween. The driving board 84, whose board surface faces the width direction of the apparatus, is disposed on the side of the side plate 86B opposite to the supply unit 56. The driving board 84 is fixed to the side plate 86B with the spacers 88 interposed therebetween. The driving board 84 and the light emitting units 52 are electrically connected via flexible printed circuit boards (not depicted).

Operation and Summary

Next, the operation of the light irradiation device 50 and the light irradiation system 40 will be described in comparison with a light irradiation device 250 and a light irradiation system 240 according to a comparative embodiment. First, with regard to the light irradiation device 250 and the light irradiation system 240 according to the comparative embodiment, portions that differ from the light irradiation device 50 and the light irradiation system 40 will be mainly described.

Figure 9:
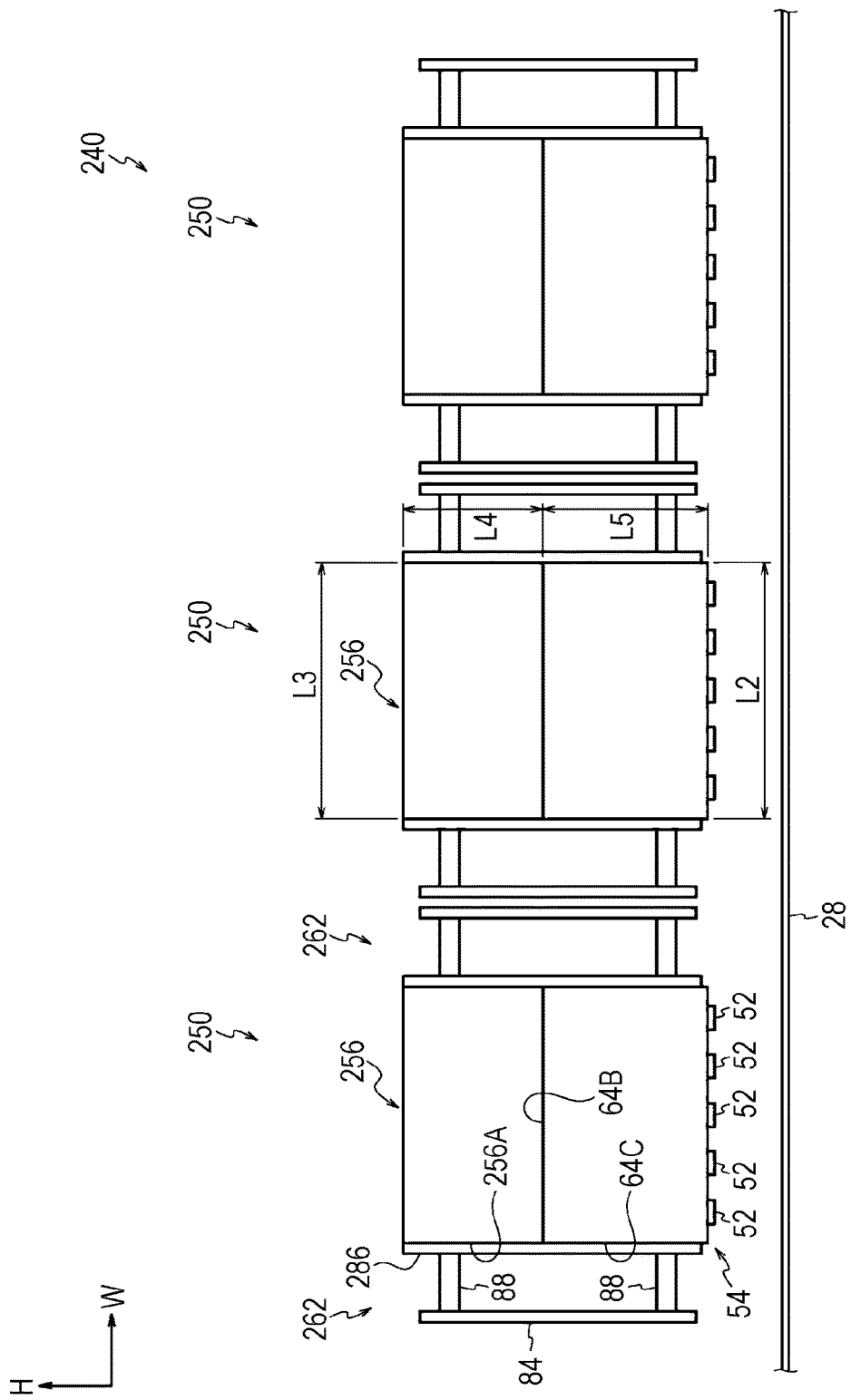
FIG. 9 is a front view of a light irradiation system according to a comparative embodiment with respect to the first exemplary embodiment of the present invention.

As depicted in FIG. 9, the light irradiation system 240 includes three light irradiation devices 250 aligned in the width direction of the apparatus.

A supply unit 256 of each of the light irradiation devices 250 has a rectangular parallelepiped shape extending in the depth direction of the apparatus, and the length of the supply unit 256 in the width direction of the apparatus (L3 in FIG. 9) is similar to the length of the cooling unit 54 in the width direction of the apparatus (L2 in FIG. 9). The length of the supply unit 256 in the top-to-bottom direction of the apparatus (L4 in FIG. 9) is shorter than the length of the cooling unit 54 in the top-to-bottom direction of the apparatus (L5 in FIG. 9). The supply unit 256 is fixed by using fixing members (not depicted) to the second surfaces 64B of the three cooling units 54 arranged in the depth direction of the apparatus.

A driving unit 262 of the light irradiation device 250 has two parts, each of which faces, in the width direction of the apparatus, a side surface 256A of the supply unit 256 and the side surfaces 64C of the cooling units 54. The side surface 256A faces the width direction of the apparatus. The two parts of the driving unit 262 form a symmetrical shape with the cooling units 54 and the supply unit 256 interposed therebetween when viewed in the depth direction of the apparatus. Hereinafter, one of the parts of the driving unit 262 will be described.

Each of the parts of the driving unit 262 includes the driving board 84 that drives the light emitting units 52, a plate-like bracket 286 with which the driving board 84 is fixed to the side surface 256A of the supply unit 256 and the side surfaces 64C of the cooling units 54, and the multiple spacers 88.

The plate surface of the bracket 286 is in contact with the side surface 256A of the supply unit 256 and the side surfaces 64C of the cooling units 54. The bracket 286 is fixed to the side surface 256A of the supply unit 256 and the side surfaces 64C of the three cooling units 54 arranged in the depth direction of the apparatus by using fixing members (not depicted).

The driving board 84, whose board surface faces the width direction of the apparatus, is disposed on the side of the bracket 286 opposite to the cooling units 54 and the supply unit 256. The driving board 84 is fixed to the bracket 286 with the spacers 88 interposed therebetween. The driving board 84 and the light emitting units 52 are electrically connected via flexible printed circuit boards (not depicted).

In contrast, for the light irradiation device 50, as depicted in FIG. 1, the length of the supply unit 56 in the width direction of the apparatus (L1 in FIG. 1) is shorter than the length of the cooling unit 54 in the width direction of the apparatus (L2 in FIG. 1). In addition, the driving unit 62 is disposed so as to face the second surfaces 64B of the cooling units 54 in the top-to-bottom direction of the apparatus.

Thus, for the light irradiation device 50, the length in the width direction of the light irradiation device 50 is shorter than the length of the light irradiation device 250, for which the driving unit 262 is disposed so as to face the side surfaces 64C of the cooling units 54. The width direction of the light irradiation device 50 is defined to be a direction that intersects (perpendicularly in this exemplary embodiment) two directions, one of which is the direction that the first surfaces 64A on which the light emitting units 52 are mounted face and the other of which is the lengthwise direction of the cooling units 54.

The screws 90 are screwed from above into the mounting holes 66 on the second surfaces 64B of the cooling units 54 through the through holes 87 of the bottom plate 86A of the bracket 86, and the driving unit 62 is fixed to the cooling units 54. If, for example, the driving unit is fixed to the cooling unit by placing a bracket of the driving unit on top of the side surfaces 64C of the cooling units 54 and screwing screws into mounting holes of the side surfaces 64C of the cooling units 54 through holes of the bracket in the width direction, the screws constitute the outermost portion of the light irradiation device in the width direction. When the driving unit 62 is fixed to the cooling units 54 by screwing the screws 90 into the mounting holes 66 of the cooling units 54 from above, protrusion of the screws 90 in the width direction of the light irradiation device 50 is avoided in comparison with a case where the driving unit is fixed to the cooling unit by screwing the screws into the mounting holes of the cooling unit 54 in the width direction.

The length in the width direction of the light irradiation system 40, which includes the light irradiation devices 50, is shorter than the length in the width direction of the light irradiation system 240, which includes the light irradiation devices 250.

The image forming apparatus 10, which includes the light irradiation devices 50, occupies less space compared with a case of including the light irradiation devices 250.

Second Exemplary Embodiment

An example of a light irradiation device, a light irradiation system, and an image forming apparatus according to a second exemplary embodiment of the present invention will be described with reference to FIG. 10. With regard to the second exemplary embodiment, portions that differ from the first exemplary embodiment will be mainly described.

As depicted in FIG. 10, a light irradiation system 140 according to the second exemplary embodiment includes three light irradiation devices 150 aligned in the width direction of the apparatus (sheet transport direction).

Multiple mounting holes 59 are formed on a side surface 58 of a supply unit 56 of each of the light irradiation devices 150 so that a bracket 186 described below is fixed to the supply unit 56. The side surface 58 faces the width direction of the apparatus.

A driving unit 162 of the light irradiation device 150 has two parts, one of which is disposed on one side of the supply unit 56 in the width direction of the apparatus, and the other of which is disposed on the other side of the supply unit 56. Each of the parts of the driving unit 162 includes a driving board 84, the plate-like bracket 186 with which the driving board 84 is fixed to the side surface 58 of the supply unit 56, and multiple spacers 88.

The plate surface of the bracket 186 is in contact with the side surface 58 of the supply unit 56, and the bracket 186 has multiple through holes 187. Screws 90 are screwed into the mounting holes 59 of the supply unit 56 through the through holes 187 in the width direction, and the driving unit 162 (bracket 186) is fixed to the supply unit 56.

Thus, because the plate surface of the driving unit 162 is in contact with the side surface 58 of the supply unit 56, the driving unit 162 is effectively cooled by cooling liquid flowing through the inside of the supply unit 56 in comparison with a case where the driving unit 162 is separated from the side surface 58 of the supply unit 56.

Other operation of the second exemplary embodiment is similar to the operation of the first exemplary embodiment except the operation performed by the driving unit 62 being fixed to the second surfaces 64B of the cooling units 54.

Specific exemplary embodiments of the present invention have been described in detail, but the present invention is not limited to the exemplary embodiments. Obviously other various exemplary embodiments are possible within the scope of the present invention as appreciated by those skilled in the art. For example, surface emitting lasers are used for the light emitting units 52 in the exemplary embodiments described above, but any component may be used for the light emitting unit as long as the component emits light while generating heat. For example, other light emitting devices such as surface emitting LEDs may be used. Further, cooling gas may be used instead of the cooling liquid. The cooling medium (fluid) is not particularly limited as long as the medium performs a cooling function.

Further, in the exemplary embodiments described above, the light irradiation system 40 includes the three light irradiation devices 50, and the light irradiation system 140 includes the three light irradiation devices 150. The light irradiation system may include two light irradiation devices or four or more light irradiation devices.

Although the driving unit 62 is fixed to the cooling units 54 directly in the first exemplary embodiment, the driving unit 62 may be fixed to the cooling unit 54 with another member interposed therebetween as long as the driving unit 62 is disposed facing the second surfaces 64B of the cooling units 54 in the top-to-bottom direction of the apparatus.

Further, although the light irradiation devices 50 and 150 are used as a device to dry the sheet members P in the exemplary embodiments described above, the light irradiation devices 50 and 150 may be used for laser machining to cut materials or annealing process of resins, for example.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light irradiation device comprising:
a light emitting unit that emits light while generating heat;
a cooling unit that includes a channel through which a coolant flows, a first surface on which the light emitting unit is mounted, and a second surface that faces a direction opposite to the first surface;
a supply unit having a rectangular parallelepiped shape extending in a depth direction of the light irradiation device, and the supply unit is disposed facing the second surface in one direction that the second surface faces, the supply unit supplying the coolant to the cooling unit and a length of the supply unit in a width direction of the light irradiation device is shorter than a length of the cooling unit in the width direction of the light irradiation device; and
a driving unit that is disposed facing the second surface in the one direction, the driving unit including:
a driving board that drives the light emitting unit;
a bracket with which the driving board is fixed to the second surface of the cooling unit, and the bracket extends in the depth direction of the light irradiation device, wherein the bracket comprises: a bottom plate whose plate surface is in contact with the second surfaces of the cooling unit; and a side plate whose plate surface faces the width direction of the light irradiation device; and
a plurality of spacers, being interposed between the driving board and the side plate.

2. The light irradiation device according to claim 1, wherein the driving unit is fixed to the second surface by using a fixing member.

3. The light irradiation device according to claim 1, wherein the driving unit is in contact with the supply unit.

4. The light irradiation device according to claim 2, wherein the driving unit is in contact with the supply unit.

5. A light irradiation system comprising:
a plurality of light irradiation devices, each being the light irradiation device according to claim 1, wherein the plurality of light irradiation devices are disposed side-by-side in a width direction in which the supply unit and the driving unit are aligned.

6. An image forming apparatus comprising:
an image forming unit that forms an image on a recording medium; and
the light irradiation device according to claim 1, the light irradiation device irradiating with light the recording medium on which the image is formed to dry the recording medium.

* * * * *